(12) United States Patent
Fujimori et al.

(10) Patent No.: US 6,683,361 B2
(45) Date of Patent: Jan. 27, 2004

(54) SOLAR CELL AND SOLAR CELL UNIT

(75) Inventors: Yuji Fujimori, Suwa (JP); Tsutomu Miyamoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 121 days.

(21) Appl. No.: 09/914,293

(22) PCT Filed: Dec. 26, 2000

(86) PCT No.: PCT/JP00/09241
§ 371 (c)(1),
(2), (4) Date: Nov. 6, 2001

(87) PCT Pub. No.: WO01/48833
PCT Pub. Date: Jul. 5, 2001

(65) Prior Publication Data
US 2002/0158297 A1 Oct. 31, 2002

(30) Foreign Application Priority Data
Dec. 27, 1999 (JP) .......................... 11-371207
Nov. 9, 2000 (JP) ...................... 2000-342007

(51) Int. Cl.⁷ .................. H01L 31/00; H01L 35/24
(52) U.S. Cl. ................ 257/431; 257/40; 257/43; 257/184; 257/111; 257/465; 257/449

(58) Field of Search .................. 136/263, 248, 136/252, 255, 260, 265, 256, 258, 264; 257/40, 43, 184, 431, 111, 465, 449

(56) References Cited

U.S. PATENT DOCUMENTS

| 5,482,570 A | * | 1/1996 | Saurer et al. ............... 136/255 |
| 6,084,176 A | * | 7/2000 | Shiratsuchi et al. ........ 136/248 |
| 6,194,650 B1 | * | 2/2001 | Wakayama et al. ......... 136/256 |
| 6,384,321 B1 | * | 5/2002 | Mikoshiba et al. ......... 136/263 |

FOREIGN PATENT DOCUMENTS

JP  11-354169  12/1999

OTHER PUBLICATIONS

Grätzel, Michael et al., "A low–cost, high–efficiency solar cell based on dye–sensitized colloidal TiO₂ films", *Nature*, vol. 353, Oct. 24, 1991, pp. 737–740.

* cited by examiner

*Primary Examiner*—Minhloan Tran
*Assistant Examiner*—Tan Tran
(74) *Attorney, Agent, or Firm*—Oliff & Berridge, PLC

(57) ABSTRACT

The solar cell of the present invention includes a titanium dioxide semiconductor that is held between a pair of electrodes so that the titanium dioxide semiconductor and at least one of the electrodes form a rectification barrier.

29 Claims, 5 Drawing Sheets

SOLAR CELL AND SOLAR CELL UNIT

BACKGROUND OF THE INVENTION

The present invention relates to a semiconductor, a solar cell employing the semiconductor, a method of manufacturing the solar cell, and a solar cell unit employing the solar cell.

DESCRIPTION OF THE RELATED ART

For the approximately the past ten years, grate attention has been paid to solar cells (solar batteries) employing silicon as a power source which is harmless to the environment. As for these solar cells employing silicon, a monocrystalline silicon type solar cell is known, which is used in artificial satellites or the like. In addition, a practical application of a solar cell is also known employing polycrystalline silicon (single crystal silicon) and a solar cell employing amorphous silicon. These solar cells have already been practically used in industrial and household applications.

However, since these solar cells employing silicon are manufactured through a vacuum process, such as a CVD (chemical vapor deposition) process or the like, manufacturing cost is high. Further, since a great deal of quantity of heat and a great deal of electricity are used in the manufacturing process, the balance between the energy required for manufacturing the solar cell and the energy generated by the solar cell is very poor. Thus, these solar cells are not yet established as an energy-saving power source.

On the other hand, a new type of solar cell, which is referred to as "wet solar cell" or "fourth-generation photocell", was proposed in 1991 by Grätzel et al. As shown in FIG. 9, this wet solar cell includes one electrode 901 formed of titania (titanium dioxide), which is a semiconductor, and another electrode 902 formed of platinum, ITO or the like, and these electrodes are held in an electrolyte solution 903, such as an iodine solution.

The reaction principle of this wet solar cell is as follows. When receiving rays such as solar rays, the titania ($TiO_2$), which is a semiconductor, receives electrons to deliver them to the electrodes, and holes ($h^+$), which are left in the titania electrode, oxidize iodine ions to convert $I^-$ into $I^-_3$. Then, the iodine ions, which have been oxidized, receive the electrons again to be reduced at the counter electrode. Thus, the iodine ions are cyclically moved between both of the electrodes, thereby realizing the battery.

In this wet solar cell employing such an electrode formed of titania, however, only the ultraviolet rays in the solar rays are efficiently utilized. Therefore, in order to increase sensitivity of the solar cell so as to be able to absorb light up to the visible ray region, the titania is mixed with organic dye or the like. For this reason, such a wet solar cell is called as a dye-sensitized solar cell. Since this type of wet cell can be manufactured from inexpensive materials and does not need a large scale equipment, such as an equipment for the vacuum process and the like for its manufacturing, it is greatly expected that this wet solar cell will be a low cost solar cell.

SUMMARY OF THE INVENTION

However, since this dye-sensitized solar cell is a wet cell employing an electrolyte, such as an iodine solution or the like, it is necessary to seal its solar cell containing the iodine solution as the electrolyte with a sealing material. Due to this structure, the dye-sensitized solar cell is subject to many problems in that, for example, leakage of electrolyte solution is liable to occur when the sealing is broken and the like.

Therefore, the dye-sensitized solar cell cannot have a practical life as a solar cell.

Further, current and voltage of practically required levels cannot be secured by simply employing a flat-shaped titanium electrode because of its small absorption area of solar rays.

In view of the above problems, the present invention is directed to a solar cell employing a titanium dioxide semiconductor, which includes a pair of electrodes; and a titanium dioxide semiconductor which is held between the electrodes, the surface and inside of the titanium dioxide semiconductor being formed with pores, and the titanium dioxide semiconductor being arranged so as to form a rectification barrier with respect to at least one of the electrodes.

This makes it possible to provide a solar cell which can secure current and voltage of practically required levels, that is, a solar cell which is excellent in the photoelectric conversion efficiency.

In the present invention, it is preferred that the rectification barrier is formed by contacting the titanium dioxide semiconductor with at least one of the electrodes, and the rectification barrier has a diode characteristic. According to this structure, it is possible to enhance the efficiency of power generation of the solar cell.

Further, it is preferred that the rectification barrier is the shottky barrier being formed by contacting the titanium dioxide semiconductor with at least one of said electrodes. According to this structure, it is also possible to enhance the efficiency of power generation of the solar cell.

Alternatively, it is also preferred that the rectification barrier is the PN junction being formed by contacting the titanium dioxide semiconductor with at least one of said electrodes. This also enables enhancement of the efficiency of power generation of the solar cell.

In this invention, it is also preferred that the electrode, with which said titanium dioxide semiconductor forms the rectification barrier, is formed in such a way as to penetrate into the surface of the titanium dioxide semiconductor and the inside thereof. This makes it possible to further increase the area (surface area) where the rectification barrier is formed, thereby further enhancing the efficiency of power generation of the solar cell.

Further, in the present invention, it is also preferred that the titanium dioxide semiconductor has a porosity of 5 to 90%. This increases the contacting area between the titanium dioxide semiconductor and light (that is, the irradiated area by light), thereby enhancing the efficiency of power generation of the solar cell.

Preferably, the titanium dioxide semiconductor has a porosity of 15 to 50%. This further increases the contacting area between the titanium dioxide semiconductor and light (that is, the irradiated area by light), thereby further enhancing the efficiency of power generation of the solar cell.

More preferably, said titanium dioxide semiconductor has a porosity of 20 to 40%. This further more increases the contacting area between the titanium dioxide semiconductor and light (that is, the irradiated area by light), thereby further more enhancing the efficiency of power generation of the solar cell.

In the present invention, it is also preferred that the titanium dioxide semiconductor is porous and has the fractal structure. This also enhances the efficiency of power generation of the solar cell.

Further, in the present invention, it is preferred that the electrode with which said titanium dioxide semiconductor form the rectification barrier is formed from a transparent electrode made of ITO or the like, or a metallic electrode made of a metal selected from the group consisting of Al, Ni, Cr, Pt, Ag, Au, Cu, Mo, Ti, and Ta, or a metal compound containing therein any one or more of these metals. This also enhances the efficiency of power generation of the solar cell.

Furthermore, it is also preferred that the electrode with which said titanium dioxide semiconductor forms the rectification barrier includes a solid iodide. This also enhances the efficiency of power generation of the solar cell.

Moreover, it is preferred that said titanium dioxide semiconductor forms the rectification barrier includes CuI (copper iodide). This enhances the efficiency of power generation of the solar cell.

Moreover, it is also preferred that said titanium dioxide semiconductor forms the rectification barrier includes AgI (silver iodide). This also enhances the efficiency of power generation of the solar cell.

Further, in the present invention, it is also preferred that the electrodes are formed by vacuum evaporation. This makes it possible to reliably contact the titanium dioxide semiconductor with the electrode so that the efficiency of power generation of the solar cell is further enhanced.

Alternatively, it is also possible to form the electrode using use spattering method. This also makes it possible to reliably contact the titanium dioxide semiconductor with the electrode so that the efficiency of power generation of the solar cell is further enhanced.

Further, it is also possible to form the electrode using use printing method. This also makes it possible to reliably contact the titanium dioxide semiconductor with the electrode so that the efficiency of power generation of the solar cell is further enhanced.

Furthermore, in the present invention, it is also preferred that the titanium dioxide semiconductor is subjected to visual rays absorbable processing for making it possible to absorb visible rays. This makes it possible for the titanium dioxide semiconductor to utilize light in the visual ray region, thereby enabling to enhancement of the efficiency of power generation of the solar cell.

In this case, it is preferred that organic dye is adsorbed to said titanium dioxide semiconductor. This is a preferable means as the visual rays absorbable processing, which enables enhancement of the efficiency of power generation of the solar cell.

In this case, it is preferred that inorganic dye is adsorbed to said titanium dioxide semiconductor. This is also preferable means as the visual rays absorbable processing, which also enables enhancement of the efficiency of power generation of the solar cell.

Alternatively, it is also possible that the inorganic dye being adsorbed to said titanium dioxide semiconductor includes inorganic carbon. This is also a preferable method of performing the visual rays absorbable processing, thereby enabling enhancement of the efficiency of power generation of the solar cell.

In this case, it is also preferred that the inorganic dye being adsorbed to said titanium dioxide semiconductor includes an inorganic matter obtained by dying carbon. This is also a preferable method of performing the visual rays absorbable processing, thereby enabling enhancement of the efficiency of power generation of the solar cell.

In the present invention, it is also preferred that the titanium dioxide semiconductor has oxygen defects. This makes it possible for the titanium dioxide semiconductor to utilize light in the visual ray region, thereby enabling enhancement of the efficiency of power generation of the solar cell.

Alternatively, it is also preferred that the titanium dioxide semiconductor includes impurities such as Cr and/or V. This makes it possible to prevent the crystalline structure of the titanium dioxide semiconductor from being changed.

Another aspect of the present invention is directed to a solar cell unit employing a titanium dioxide semiconductor, which includes a solar cell which includes a pair of electrodes, and a titanium dioxide semiconductor which is held between the electrodes, the titanium dioxide semiconductor being formed with pores, and first and second substrates which holds the solar cell therebetween. According to this structure, it is possible to provide a solar cell unit which can utilize current and voltage of practically required levels, that is a solar cell unit which is excellent in power generation efficiency (photoelectric transfer efficiency).

In this invention, it is preferred that a solar cell unit has first and second substrates arranged so that solar rays enter from the side of one of the substrates, in which the other substrate arranged at the opposite side is coated with a reflection film or has a reflection film thereon. This makes it possible to effectively prevent the passing of light, so that utilizing efficiency of light is further enhanced. With this result, it is possible to enhance the efficiency of power generation of the solar cell.

In this solar cell unit, it is preferred that the first and second substrates are arranged so that solar rays enter from the side of one of the substrates, in which the other substrate arranged at the opposite side is coated with a reflection film or has a reflection film thereon. This arrangement makes it possible to prevent or suppress passing of the light effectively so that the solar cell unit can utilize the light more efficiently. With this result, it is possible to enhance the efficiency of power generation of the solar cell.

Preferably, in this solar unit, the space between the first substrate and the second substrate is filled with an inert gas such as argon gas. This makes it possible to extend the durability of the solar cell unit.

Further, it is also preferred that at least one of the first and second substrates, arranged at the side from which solar rays enter, is formed into a transparent substrate or a translucent substrate formed of glass, plastic or synthetic resin. This arrangement makes it possible to reliably transmit the light to the light receiving surface of the solar cell cell.

Furthermore, in this solar cell unit, it is also preferred that at least one of the first and second electrodes, arranged at the side from which solar rays enter, has a top surface and a bottom surface, and an anti-reflection film is coated or placed on the tip surface or bottom surface. This arrangement makes it possible to reliably transmit the light to the light receiving surface of the solar cell cell and enables enhancement of the efficiency of power generation of the solar cell. With this result, it is possible to enhance the efficiency of power generation of the solar cell.

Moreover, in this solar cell unit, it is also preferred that at least one of the first and second electrodes, arranged at the side from which solar rays enter, has a top surface, and a light catalyst made of titanium dioxide ($TiO_2$) is coated on or placed on the top surface. According to this structure, it possible to degrade impurity substances (such as deoxidized carbon, and organic matters) by the light catalyst, even in the case where the solar cell unit is used out-doors, it is possible to prevent the surfaces of the first sand or second electrode from being contaminated in a preferred manner.

DETAILED DESCRIPTION OF THE PREFERRED EMBODIMENTS

Figure 1:
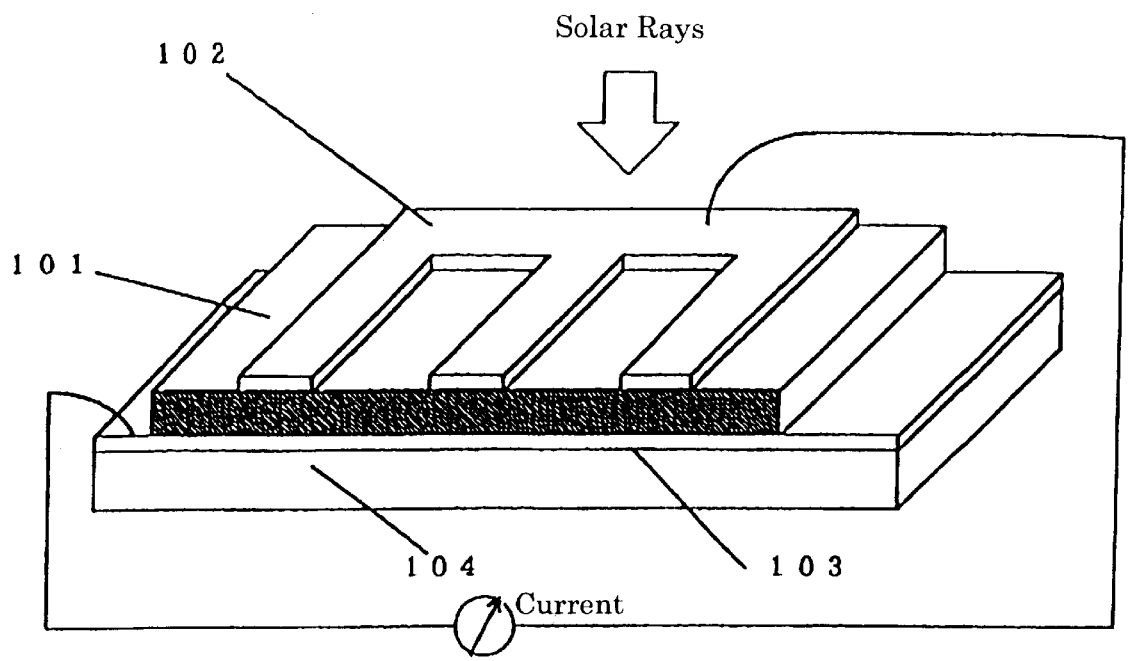
FIG. 1 schematically shows the structure of a solar cell of an embodiment according to the present invention.

Hereinbelow, embodiments according to the present invention will be described in detail with reference to the accompanying drawings. FIG. 1 to FIG. 8 schematically show the structures, the circuit and the like of a solar cell and a solar cell units according to the present invention.

In this regard, it is to be noted that the reference numerals 101, 201, 301, 401, 601, 701 and 801 used in FIG. 1 to FIG. 4 and FIG. 6 to FIG. 8 designate respectively a titanium dioxide semiconductor (titania semiconductor). For the sake of convenience, the different reference numerals are assigned to designate the titania semiconductor in these drawings. Likewise, in these drawings, corresponding elements or the same elements other than the titanium dioxide are also designated with different reference numerals.

First Embodiment

FIG. 1 is an illustration which schematically shows the structure of a solar cell (solar cell unit) 100, which is an embodiment of a solar cell employing a semiconductor according to the present invention.

The solar cell 100 includes a first substrate 104, such as a glass substrate or a metal substrate, and a first electrode 103 formed on the first substrate 104. The first electrode 103 is formed from a transparent electrode made of ITO or the like or a metallic electrode (which is made of a metal selected from the group consisting of Al, Ni, Cr, Pt, Ag, Au, Cu, Mo, Ti and Ta, an alloy containing any one or more of these metals, or a compound containing any one of these metals).

An anatase type titanium dioxide ($TiO_2$) semiconductor 101 is formed on the first electrode 103. The titanium dioxide ($TiO_2$) semiconductor is an n-type semiconductor.

A comb-shaped (stripe-like) second electrode 102 is formed on the anatase type titanium dioxide ($TiO_2$) semiconductor 101. Although the comb-shaped second electrode shown in FIG. 1 is illustrated to have three electrode teeth, a comb-shaped second electrode 102 of an actual model can have a more number of stripe-like comb-shaped electrode teeth.

Figure 2:
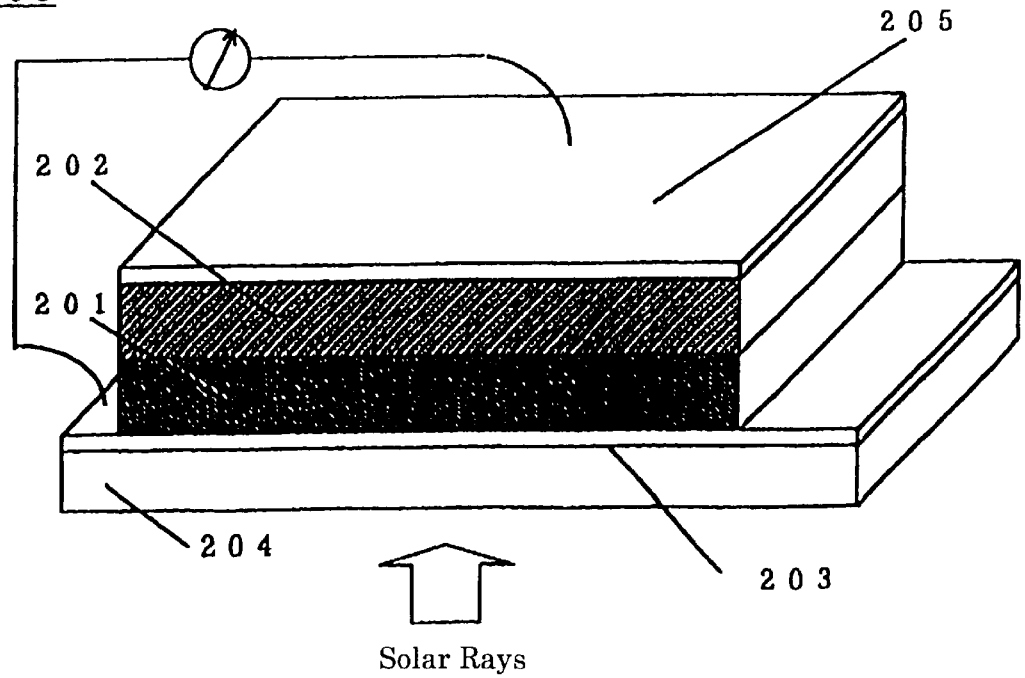
FIG. 2 schematically shows the structure of the solar cell of another embodiment according to the present invention.

Alternatively, as shown in FIG. 2, the second electrode 202, which is formed on the anatase type titanium dioxide ($TiO_2$) semiconductor 201, may be formed into a full-face type electrode which covers a part of or an entire of the surface of the titanium dioxide ($TiO_2$) semiconductor 201.

On the second electrode 202, a third electrode 205 that supports the second electrode may be formed. This third electrode includes a substrate, such as a glass substrate or a metallic substrate, and on the substrate there is formed a transparent electrode made of ITO or the like or a metallic electrode (which is made of a metal selected from the group consisting of Al, Ni, Cr, Pt, Ag, Au, Cu, Mo, Ti and Ta, or an alloy containing any one or more of these metals).

In the present invention, each of the second electrodes 102, 202 shown in FIG. 1 and FIG. 2 is constructed from a metallic electrode (which is made of a metal selected from the group consisting of Al, Ni, Cr, Pt, Ag, Au, Cu, Mo, Ti and Ta, an alloy containing any one or more of these metals, a compound containing therein any one of the above-mentioned metals such as CuI, CuSCN, AgI, CuBr, $Ag_2S$, $RbAg_4I_5$, AgBr, $\beta$-$Al_2O_3$ ($NaO.nAl_2O_3$), or the like).

In this case, as shown in FIG. 1 and FIG. 2, since each of the titania semiconductors 101, 201 is in contact with the first electrode or the above-mentioned second electrode, respectively, a rectification barrier (the Schottky barrier or the PN junction), which has an energy height corresponding to the difference in the work function between the titania semiconductor 101 or 201 and the first electrode or the second electrode, is formed in the interface therebetween, so that rectification occurs.

For example, when the titanium dioxide ($TiO_2$) semiconductor is in contact with the second electrode 102 or 202 and the work function of each of the second electrodes 102, 202 is larger than that of the titanium dioxide ($TiO_2$) semiconductor, rectification occurs due to the presence of the Schottky barrier or the PN junction.

In this case, as for the constituent material of each of the second electrodes 102, 202, any one of the materials described above, in particular a material having the ion conduction property, is preferably employed.

As for the material having the ion conduction property, one kind of or two or more kinds of metal halide compounds, such as a metal iodide compound such as CuI or AgI, and a metal bromide compound, such as AgBr, may be used, for example. Among these compounds, it is particularly preferable to use one kind of, or two or more kinds of, the metal iodide compounds, such as CuI and AgI.

Figure 5:
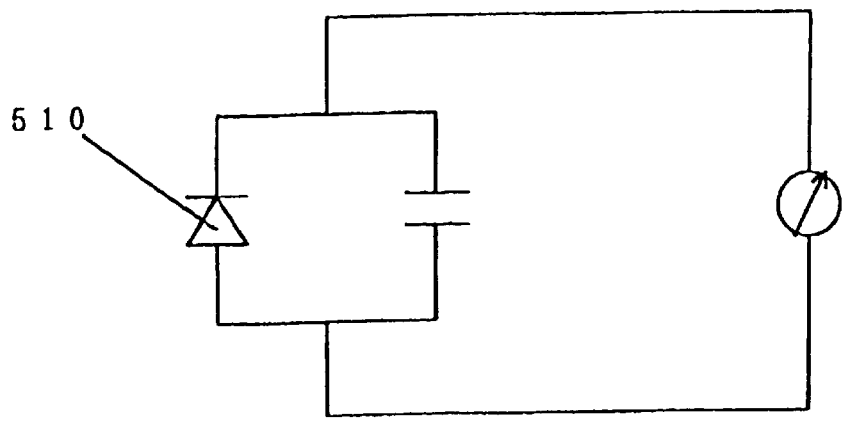
FIG. 5 is a circuit diagram which shows an equivalent circuit of the solar cell of the embodiment according to the present invention.

The situation caused in the solar cells described above can be represented with an equivalent circuit shown in FIG. 5. As shown in this figure, it can be seen that a circulation circuit of a current including a diode 510 is formed.

Specifically, when rays, such as solar rays, strike the periphery of the interface between the titania semiconductor 101 or 201 and the second electrode 102 or 202, electrons are excited in the periphery of the interface between the titania semiconductor and the second electrode to generate electrons and holes (positive holes). The electrons and the positive holes generate a current, thereby forming a loop of the current in the solar cell, as shown in the equivalent circuit of FIG. 5.

Figure 3:
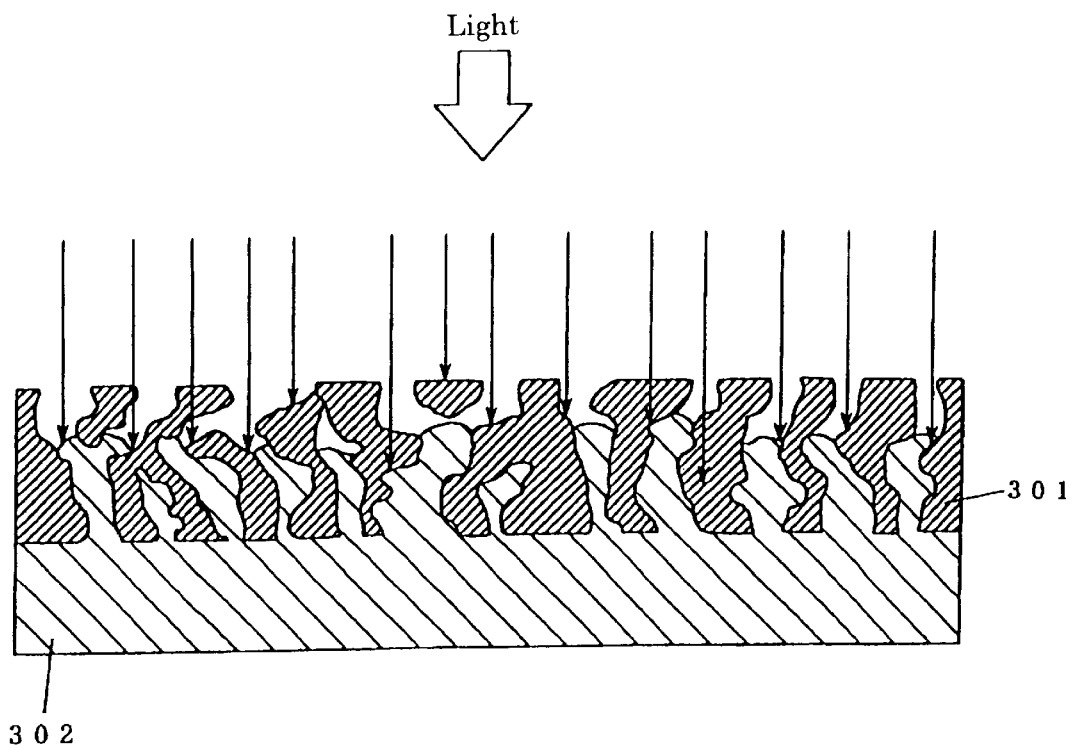
FIG. 3 is a cross-sectional view which schematically shows the structure of the solar cell of the embodiment according to the present invention.
Figure 4:
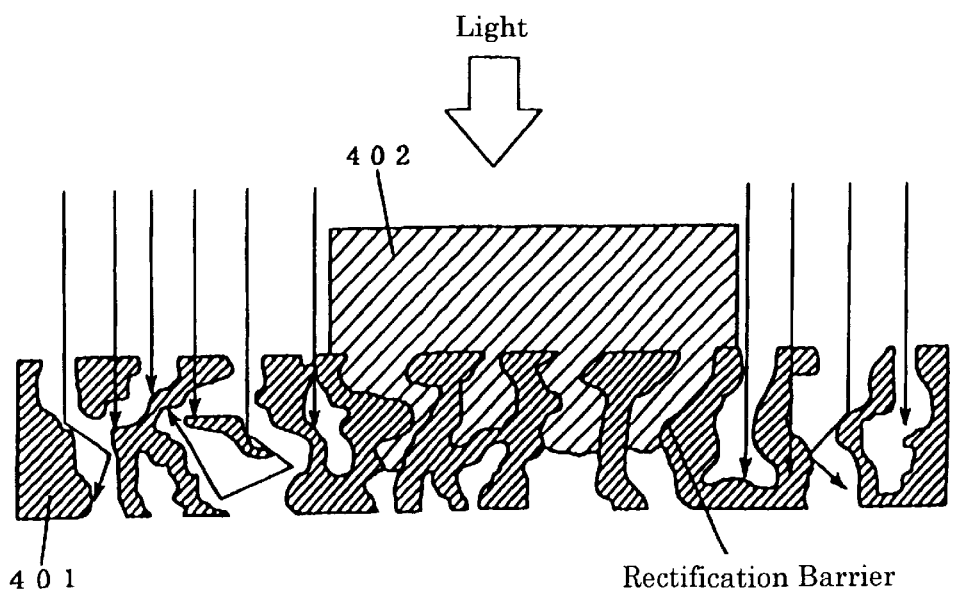
FIG. 4 is a cross-sectional view which schematically shows the structure of the solar cell of the embodiment according to the present invention.

FIG. 3 and FIG. 4 show the structure of the solar cell of the embodiment according to the present invention.

FIG. 3 shows the situation in which an electrode 302 of the solar cell (corresponding to the second electrode 102, 202 of FIG. 1 and FIG. 2), which is made of a metal, a metal alloy, a metal compound or the like, is in contact with or joined to a titanium dioxide ($TiO_2$) semiconductor 301.

As shown in FIG. 3, the second electrode 302 penetrates into the pores of the titanium dioxide semiconductor 301 so that the titanium dioxide semiconductor 301 and the second electrode 302 form therebetween the Schottky barrier or the PN junction. With this result, the surface area of the Schottky barrier or the PN junction, which is formed between the metal (the metallic electrode 302) and the semiconductor (the titanium dioxide ($TiO_2$) semiconductor 301), is increased.

For example, when the titanium dioxide semiconductor 301, which is an n-type semiconductor, and an electrode of CuI (the second electrode 302), which is a p-type semiconductor, are used, PN junction is created therebetween, so that a diode is formed in the junction part due to the PN junction.

FIG. 4 shows the situation in which solar rays strike the solar cell shown in FIG. 1. Specifically, solar rays strike the metallic electrode (represented by 402) and a part of the titanium dioxide ($TiO_2$) semiconductor (represented by 401) where no metallic electrode is formed.

Further, in FIG. 3 and FIG. 4, the arrows indicate the traveling directions of the rays, and these figures show the situation in which the rays strike on the surface and enter the pores of the titanium dioxide semiconductor.

As shown in FIG. 4, the titanium dioxide ($TiO_2$) semiconductor 401 and the metallic electrode (second electrode) 402 are in contact with each other to form therebetween the Schottky barrier or the PN junction.

In this case, the metallic electrode 402 formed on the surface of the titanium dioxide ($TiO_2$) semiconductor penetrates into the pores of the titanium dioxide semiconductor 401. As a result, the surface area of the Schottky barrier or the PN junction, which is formed between the metal (the metallic electrode 402) and the semiconductor (the titanium dioxide ($TiO_2$) semiconductor 401), is increased.

Further, since the titanium dioxide semiconductor 401, which is an n-type semiconductor, is jointed to the electrode of CuI (the second electrode 402), which is a p-type semiconductor, PN junction is created therebetween, so that a diode is formed in the junction part due to the PN junction.

The metallic electrode 402, which is provided on the surface of the titanium dioxide ($TiO_2$) semiconductor, is constructed from a transparent electrode made of ITO or the like, or a metallic electrode (which is made of a metal selected from the group consisting of Al, Ni, Cr, Pt, Ag, Au, Cu, Mo, Ti and Ta, an alloy containing therein any one of these metallic materials, or a compound, containing therein the above-mentioned metal, such as CuI, CuSCN, AgI, $Ag_2S$, $RbAg_4I_5$, CuBr, AgBr, $\beta$-$Al_2O_3$ ($NaO.nAl_2O_3$), or the like), and the metal electrode 402 is formed on the surface of the titanium dioxide ($TiO_2$) semiconductor by utilizing the vacuum evaporation method, the sputtering method or the printing method or the like. Among the materials mentioned above, the material having the ion conduction property is preferably used for the constituent material of the metallic electrode 402.

As for the material having the ion conduction property, one kind of, or two or more kinds of, metal halide compounds, such as a metal iodide compound such as CuI or AgI, and a metal bromide compound, such as AgBr, may be used, for example. Among these compounds, it is particularly preferable to use one kind of, or two or more kinds of, the metal iodide compounds, such as CuI and AgI.

For example, when the metallic electrode 402, which is formed on the surface of the titanium dioxide ($TiO_2$) semiconductor, is made of CuI (copper iodide), CuI is dissolved in a solvent, such as acetonitrile, to obtain a saturated solution, and then the saturated solution thus obtained is dropped onto the surface of the titanium dioxide semiconductor or on the third electrode 205 shown in FIG. 2, and then it is heated at a temperature of 100 to 180 degrees, thereby obtaining the metallic electrode 402.

As described above, since the titanium dioxide ($TiO_2$) semiconductor of the present invention has a very large porosity, solar rays not only strike on the surface of the titanium dioxide ($TiO_2$) semiconductor, but also enter the pores of the titanium dioxide ($TiO_2$) semiconductor, and thus rays that enter cause multiple-reflection repeatedly within the pores, as indicated by the arrows in FIG. 3 and FIG. 4, to cause the photovoltaic effect in the titanium dioxide ($TiO_2$) semiconductor.

Specifically, since the contact part between the metal and the semiconductor (that is, the Schottky barrier part or the PN junction part) provides the rectification function, and thereby interface potential is present therein to produce electric field due to the presence of the barrier. Therefore, when rays (photons), each having larger energy than the band gap defined between the valence band and the conduction band, enter the vicinity of the interface, the electrons and the positive holes which have been generated are drawn apart due to the electric field of the interface, thereby causing potential difference (photoelectromotive force).

Therefore, if an external circuit is electrically connected to the contact part (the Schottky barrier part or the PN junction part) as shown in FIG. 5, a photo-exciting current is obtained, thereby enabling a solar cell to be provided.

In this regard, it is to be noted that, as shown in FIG. 3 and FIG. 4, the rays which have entered the pores of the titanium dioxide semiconductor are reflected repeatedly in the pores and a part of the rays pass through downwardly. However, these rays are reflected by the surface of the flat lower electrode (first electrode) 103 shown in FIG. 1, or by a reflecting plate 714 shown in FIG. 7 (which will be described later) or a reflecting plate 816 shown in FIG. 8 (which will be described later), and they reenter the surface of the titanium dioxide semiconductor that is the pores thereof again, thereby causing the photoelectromotive force.

Each of the titania semiconductors 301, 401 is the oxide semiconductor made of an anatase type titanium dioxide, which is formed by sintering fine powder of titanium (Ti) having the particle size of about 10 nm to about 100 $\mu$m, and then oxidizing it, or the oxide semiconductor which is formed by sintering fine powder of an anatase type titania ($TiO_2$) having the particle size of about 5 nm to about 2,000 nm. The detailed description of the manufacturing method of the titanium semiconductors 301, 401 will be provided later.

Each of the titanium dioxide semiconductors 301, 401 has a very high porosity (void ratio), that is porous, thus it has the so-called fractal structure.

More specifically, as shown in FIG. 3 and FIG. 4, the porous titanium dioxide semiconductor 301 or 401 is formed from an anatase type titania semiconductor having the porosity (void ratio) of 5 to 90%. Preferably, the titanium dioxide semiconductor 301 or 401 is formed from an anatase type titania semiconductor having the porosity (void ratio) of 15 to 50%, and more preferably, it is formed from an anatase type titania semiconductor having the porosity of 20 to 40%.

As described above, by using the titanium dioxide semiconductor having the extremely high porosity, the surface area of the titania electrode is remarkably increased as compared with the case where the titania electrode is formed into a flat-shaped plate. For example, a portion of the titania defined by 1 $cm^2$ in a plane can have a total surface area of 1,000 to 10,000 cm$^2$. As a result, since the contact area between the titania and solar rays is also increased, the amount of the current flowing therethrough is mathematically expected to be 1,000 to 10,000 times as large as the case where the titania electrode is formed into a flat-shaped plate.

Second Embodiment

While the normal titania semiconductor reacts with only the ultraviolet rays in solar rays as described above, the titania semiconductor of the present invention is subjected to the processing for sensitizing to absorption wavelength of rays, such as solar rays, so as to be able to react with the rays up to the visible ray region.

Specifically, examples of such processing include (1) a method in which dye is adsorbed on the porous surface of the titania semiconductor (the dye adsorption method), (2) a method in which oxygen defects are formed in the titania to reduce the band gap in order to sensitize to the visible rays (the oxygen defect method), and (3) a method in which the titania is doped with a very small quantity of impurities (the impurity doping method), and so forth, and one kind of, or two or more kinds of, these methods can be used alone or in combination with other method.

First, the first method (the dye adsorption method) will hereinbelow be described in detail.

Each of the titania semiconductors 301, 401 shown in FIG. 3 and FIG. 4 is the oxide semiconductor made of an anatase type titanium dioxide, which is formed by sintering fine powder of titanium (Ti) having the particle size of about 10 nm to about 100 µm, and then oxidizing it, or the oxide semiconductor which is formed by sintering fine powder of an anatase type titania (TiO$_2$) having the particle size of about 5 nm to about 2,000 nm.

Each of the titanium dioxide semiconductors 301, 401 has a very high porosity, that is porous. Thus it has what is referred to as a fractal structure.

More specifically, as shown in FIG. 3 and FIG. 4, the porous titanium dioxide semiconductor 301 or 401 is formed of an anatase type titania semiconductor having the porosity (void ratio) of 5 to 90%. Preferably, the titanium dioxide semiconductor 301 or 401 is formed of an anatase type titania semiconductor having the porosity (void ratio) of 15 to 50%, and more preferably, it is formed of an anatase type titania semiconductor having the porosity of 20 to 40%.

Further, in these porous titanium dioxide semiconductors having the fractal structure described above, dye is, in advance, adsorbed on the surface of the titanium dioxide semiconductor and inside the pores thereof.

As for the dye, organic dye (metal organic dye such as ruthenium complex), inorganic dye (carbon black containing therein inorganic carbon and the like), or the like is employed.

The dye is previously dissolved in a solvent, such as alcohol, and the titanium dioxide semiconductor 301 or 401 is dipped in this solution, so that the dye is adsorbed on the surface of the titanium dioxide semiconductor 301 or 401 and inside the pores thereof. Thereafter, the titanium dioxide semiconductor 301 or 401, which is pulled up from the solution, and then it is dried naturally, whereby the dye is adsorbed and fixed on the surface of the titanium dioxide semiconductor 301 or 401 and inside the pores thereof. In this case, in order to make the dye adsorbed more firmly, it is effective to dry the titanium dioxide semiconductor 301 or 401 with a clean oven or the like at a temperature of about 60 to 100 degrees.

Next, the second method (the oxygen defect method) will hereinbelow be described in detail.

First, powder of an anatase type or a rutile type titanium dioxide (TiO$_2$) is prepared. The mean particle size of the titanium dioxide powder is not particularly limited, but it is preferably in the range of about 5 nm to about 10 µm, and it is more preferably in the range of about 5 nm to about 100 nm, for example.

The titanium dioxide (TiO$_2$) powder is subjected to reduction processing at a temperature of 600 to 1,000 degrees to reduce the oxygen contained in the titanium dioxide (TiO$_2$) so that the titanium dioxide semiconductor having oxygen defects is formed. The property of the titanium dioxide semiconductor at this time is of an n-type.

When the temperature in the reduction processing begins to exceed 800 degrees, the crystal structure of the anatase type titanium dioxide (TiO$_2$) begins to change into that of the rutile type. Therefore, the titanium dioxide (TiO$_2$) having oxygen defects can be formed into three states including the state in which only the anatase type titanium dioxide is present, the state in which the anatase type titanium dioxide and the rutile type titanium dioxide are mixedly present, and the state in which only the rutile type titanium dioxide is present.

It is effective that the reduction processing which is employed at this stage is carried out in a hydrogen atmosphere. When the reduction processing is carried out in a hydrogen atmosphere, the reduction of the oxygen contained in the titanium dioxide (TiO$_2$) is promoted by hydrogen, so that the temperature of the reduction processing can be set to a lower level. Therefore, it is also possible to subject the anatase type titanium dioxide (TiO$_2$) to the reduction processing as it is.

Next, the third method (the impurity doping method) will hereinbelow be described in detail.

Figure 6:
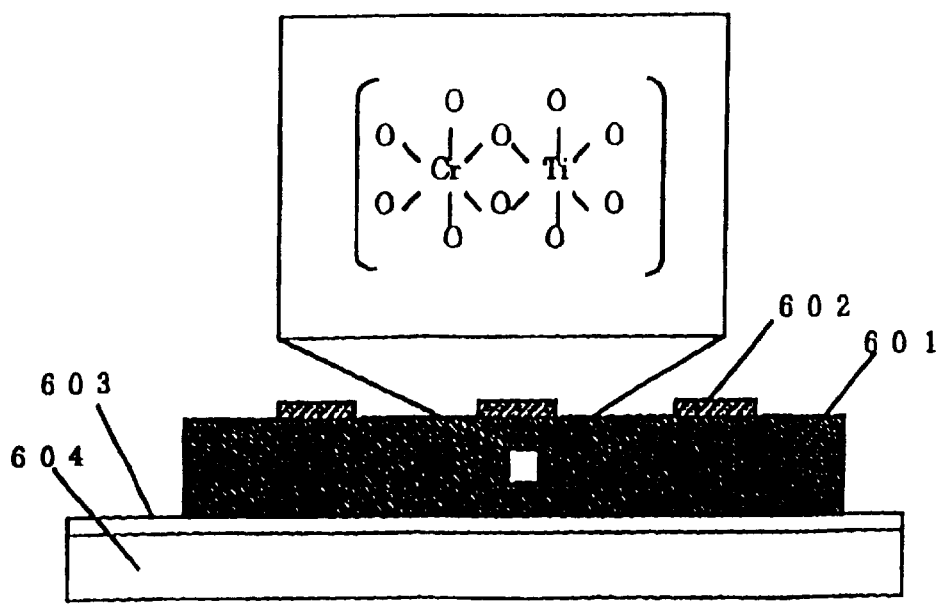
FIG. 6 is a cross-sectional view which schematically shows the structure of the solar cell of the embodiment according to the present invention.

FIG. 6 shows the structure of the titania semiconductor of the embodiment according to the present invention. As shown in FIG. 6, the titania contains therein a very small quantity of impurities, such as Cr (chromium) and V (vanadium), in the range of 0.1 to 2.5 µmol/g, and also more ideally, it is preferable that the titania contains therein impurities, such as Cr and V, in the range of 1.5 to 2.0 µmol/g.

As described above, since the titania semiconductor of the present invention is subjected to the processing for sensitizing to the absorption wavelength of rays, such as solar rays, so as to be able to react with the rays up to the visible ray region, it can absorb the visible rays having the wavelength of equal to or longer than 400 nm (normally, this means the rays having the wavelength of 400 to 750 nm) which cannot be efficiently absorbed by the normal titania semiconductor. Therefore, the titania semiconductor of the present invention can absorb solar rays at the practical level. As a result, the efficiency of the solar cell can be greatly enhanced.

Third Embodiment

Next, the method of forming the titania semiconductor films 101, 201 of the present invention will hereinbelow be described in detail.

1 Powder Molding Method

The titania semiconductor employed in the present invention is formed by utilizing what is referred to as Powder Injection Molding method (in general, it is called the PIM Method), or what is referred to as Metal Injection Molding Method (in general, it is called the MIM method).

In these methods, a resin binder of 99 to 50% in the volume ratio is added to titanium fine powder, having the particle size of about 20 to 2,000 nm, and then they are kneaded to form a source compound, having the low viscosity (in the range of 1,000 to 3,000 P) with which the injection molding can be carried out.

At this time, Cr or V is added thereto in order to increase the absorption wavelength width of rays. This may be added to the source compound, either in the state of the oxide of Cr ($CrO_3$), or in the state of the oxide of V, or added to the source compound in the state of pure Cr or in the state of pure V.

After having been subjected to the process of removing the resin binder (debinding process), the debound titanium fine powder (brown body) is sintered together with the above-mentioned additive. The titanium fine powder is oxidized through this sintering process to become the anatase type titania (titanium dioxide).

In this case, since the rutile type titania is thermally stable and the crystal structure of the anatase type titania is changed into the rutile type titania through heating at the temperature of equal to or higher than 900 degrees, the debinding process and the sintering process, including the oxidation, must be carried out at the temperature of equal to or lower than 900 degrees so that the crystal structure of the titanium oxide can be kept as the anatase type titanium dioxide.

In addition, in the sintering process, in order to obtain a titania alloy without destroying the anatase type crystal structure, $MoO_3$ (molybdenum oxide), having the melting point of 795 degrees, is added in advance as a sintering assistant to the source compound to obtain the sintered alloy of titania.

Note that, this sintering assistant is not limited to $MoO_3$ (molybdenum oxide), and hence any of other sintering assistants can be utilized as long as its melting point is equal to or lower than 900 degrees.

Alternatively, as a method of obtaining the anatase type titanium dioxide semiconductor without employing any sintering assistant, the following method can be adopted, in which after titanium fine powder has been sintered in a vacuum atmosphere at the temperature of about 1,200 degrees once, the resultant sintering body is resintered in an oxygen atmosphere at the temperature of equal to or lower than 900 degrees to oxidize the titanium sintered body, thereby obtaining a titanium dioxide semiconductor.

2 Coating Method

In addition to the above, the titania semiconductor may be formed into a film (a thick film or a thin film) by utilizing various kinds of coating or spraying methods and apparatuses, such as dipping, doctor blade, spin coating, brush application, spray coating, and roll coater.

For example, in accordance with the coating method, since the operation thereof is very simple and also no large scale equipment is required, it is advantageous in reducing the manufacturing cost of the titania semiconductor and the solar cell as well as in reducing the manufacturing time. Further, according to the coating method, a titania semiconductor having a desired pattern shape can be readily obtained by employing a masking, for example.

Now, a description will hereinbelow be given with respect to the manufacturing method of the titania semiconductor in accordance with the coating method.

In this method, the mean particle size of the titanium oxide powder is not particularly limited, but, for example, it is preferably in the range of about 5 nm to 10 μm, and is more preferably in the range of about 5 to 100 nm. Use of the titanium dioxide powder having the mean particle size within the above-mentioned range makes it possible to enhance the uniformity of the titanium oxide powder in the coating liquid (semiconductor material), as will be described later in detail.

In addition, by using the titanium oxide powder having the small mean particle size as described above, it becomes possible to obtain a super porous titania semiconductor, which makes it possible for the light receiving surface of the titania semiconductor to have an increased contact area with rays. In addition, when dye is added for sensitizing to the absorption wavelength of the visible rays, the amount of dye adsorbed to the titania semiconductor can be greatly increased.

With respect to the preparation of the coating liquid (semiconductor material), first the fine particle titanium oxide powder, having the particle size of about 5 to 100 nm, is suspended into a suitable amount of water (e.g., distilled water, super-pure water, ion exchange water, RO water or the like).

Next, a stabilizing agent, such as nitric acid or the like, is added to such suspension, and then they are sufficiently kneaded in a mortar made of agate (or made of alumina).

Next, the above-mentioned water is added to such suspension to be further kneaded therewith. At this time, the mixing ratio between the above-mentioned stabilizing agent and the water should preferably be in the range of 10:90 to 40:60 in the volume ratio, and more preferably in the range of 15:85 to 30:70. Also, the viscosity of such suspension should be in the range of about 0.2 to about 30 cps, for example.

Thereafter, a surfactant is added to such suspension, and then they are kneaded in such a way that the final concentration of the coating liquid becomes in the range of about 0.01 to 5 wt %, for example. In this way, the coating liquid (semiconductor material) is prepared.

Note that, the surfactant may be any one of the surfactants including a cationic surfactant, an anionic surfactant, a bi-ionic surfactant, and a non-ionic surfactant. However, it is preferable to use the non-ionic surfactant.

In addition, as for the stabilizing agent, instead of the nitric acid, a surface modification reagent for the titanium oxide, such as acetic acid or acetylacetone, may also be employed.

In addition, as needed, various kinds of additives, such as a binder e.g. polyethlene glycol (PEG), a plasticizer, and an antioxidant, may be added to the coating liquid (semiconductor material).

Addition of these additives, such as the binder e.g. polyethlene glycol (PEG), the plasticizer and the antioxidant, is effective for increasing the viscosity of the suspension to provide a coating liquid (semiconductor material) in paste form. In addition, the PEG serves to increase the viscosity of the titania paste and also acts as a binder for the fine particle titania when sintering the titania semiconductor.

Further, the PEG contributes to increasing the porosity of the titania semiconductor because the component of the PEG which is unnecessary as the binder is volatilized during the sintering process.

The coating liquid as described above is applied to the upper surface of the first electrodes 103, 203 shown in FIG. 1 or FIG. 2 by the coating method (e.g., the dipping or the like), and it is then dried to form a film made of the semiconductor material. In the present invention, the operation of the application and the drying of the coating liquid may also be carried out plural times to obtain a laminate of films of the semiconductor material.

Next, as needed, the film, made of the semiconductor material, is subjected to a heat treatment (e.g., the sintering or the like) at the temperature of about 250 to 500 degrees for about 0.5 to 3 hours to obtain the titanium semiconductor 101, 201. By being subjected to this treatment, among the particles of the titanium oxide powder, which were in the state that they are only in contact with each other, diffusion joining is caused at their contact parts so that the particles of the titanium oxide powder become firmly bonded to each other to some degree.

Fourth Embodiment

Figure 7:
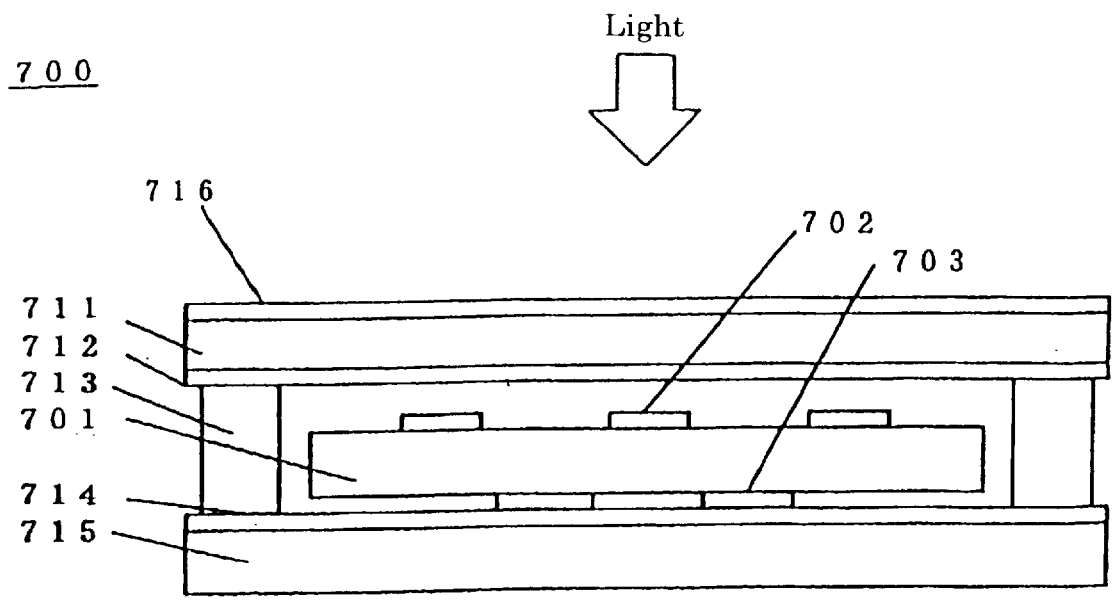
FIG. 7 is a cross-sectional view which schematically shows the structure of a solar cell unit of an embodiment according to the present invention.

FIG. 7 shows an example of the structure of a solar cell unit as a module (unit) of the solar cell of the present invention.

In this solar cell unit, a semiconductor made of titanium dioxide (a titanium dioxide semiconductor, that is a titania semiconductor) 701, is held between one pair of electrodes including an upper electrode (second electrode) 702 and a lower electrode (first electrode) 703. Each of these electrodes 702 and 703 is formed of a transparent electrode, such as ITO or a metallic electrode (which is made of a metal which is selected from the group consisting of Al, Ni, Cr, Pt, Ag, Au, Cu, Mo, Ti and Ta, an alloy containing any one or more of these metals, or a compound containing therein any one or more of the above-mentioned metals, such as CuI, CuSCN, AgI, $Ag_2S$, $RbAg_4I_5$, AgBr or $\beta$-$Al_2O_3$ ($NaO.nAl_2O_3$) or the like).

The upper electrode 702 may be either a stripe-like comb-shaped electrode including a plurality of electrode theeth, as shown in FIG. 1, or a full-face electrode, as shown in FIG. 2.

The lower electrode 703 may be either a flat electrode, which is in contact with the titanium dioxide semiconductor 701, as shown in FIG. 1, or a stripe-like comb-shaped electrode, an electrode which is not a flat electrode.

The direction of solar rays entering this solar cell cell (the solar cell unit) 700 is arbitrarily determined depending on the shape and the film quality of the electrode(s) such that the rays, such as solar rays, strike on the titanium dioxide semiconductor 701. Note that, in the solar cell unit 700 of this example, the unit is used so that the rays are made to enter from the upper side in FIG. 7.

The solar cell including the titanium dioxide semiconductor 701, which is held between the pair of electrodes 702 and 703, is accommodated in the space between an upper substrate 711 and a lower substrate 715, each of which is made of transparent glass, plastics (PET, PI, PPS or the like), resin or the like, and is sealed with a sealing material 713. The space between the substrates 711 and 715 may also be filled with an inert gas, such as argon gas.

A reflecting film (reflecting plate) 714 is formed on the upper surface of the lower substrate 715. As a result, the rays, which have passed through the titanium dioxide semiconductor 701, can be reflected towards the titanium dioxide semiconductor 701 again. However, it is to be noted that this reflecting film 714 may be omitted if it is unnecessary.

Further, in order to increase the amount of light entering the titanium dioxide semiconductor 701, an antireflection film 712 is applied to (provided on) the lower surface of the upper substrate 711.

Furthermore, the uppermost surface of the upper substrate 711 is coated (arranged) with a thin film 716 made of titanium dioxide ($TiO_2$) having photocatalyst function, since the solar cell unit 700 of the present invention is normally placed out-doors to generate electricity. By the thin film 716 made of titanium dioxide ($TiO_2$) provided on the upper substrate (cover glass) 711 of the solar cell unit 700 of the present invention, the cover glass 711 of the solar cell unit 700 can be prevented from becoming dirty and being contaminated due to carbon dioxide exhausted from automobiles and the like and organic contaminants.

Figure 8:
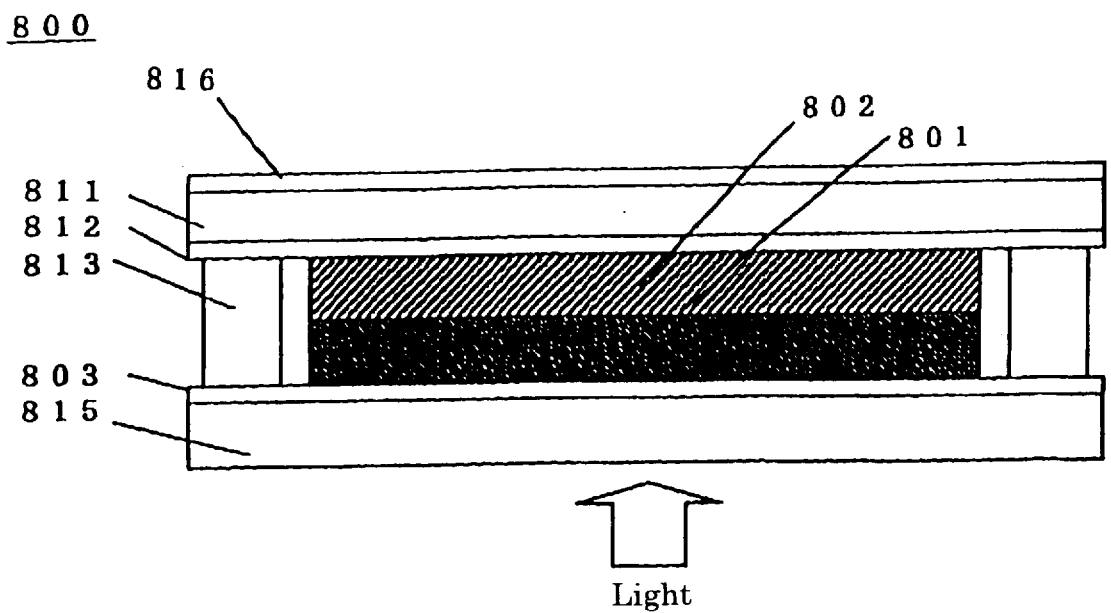
FIG. 8 is a cross-sectional view which schematically shows the structure of a solar cell unit of aother embodiment according to the present invention.
Figure 9:
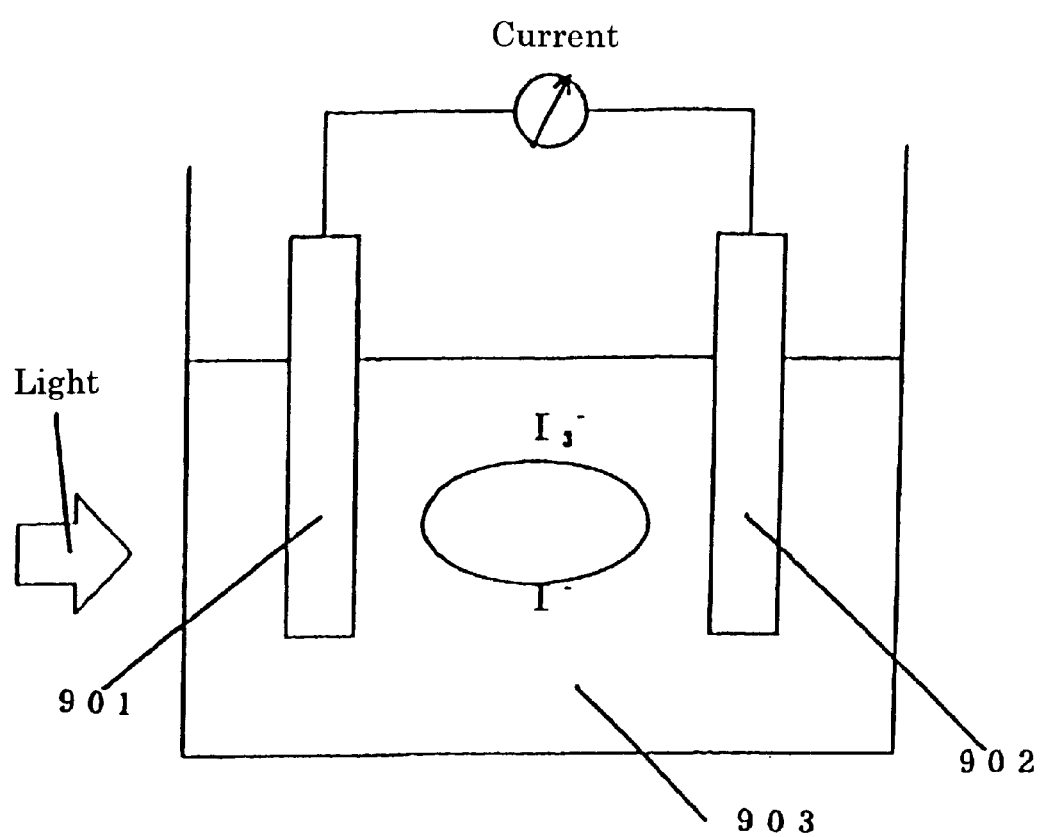
FIG. 9 is a diagram which schematically shows the structure of the conventional wet solar cell.

FIG. 8 shows another example of the structure of a solar cell unit as a module (unit) of the solar cell of the present invention.

Hereinbelow, a description will be made with regard to a solar cell unit 800 shown in FIG. 8 by focusing its difference from the above-mentioned solar cell unit 700, and an explanation for the common points will be omitted here for the sake of simplicity.

The solar cell unit 800 shown in FIG. 8 includes a lower substrate 815, a lower electrode (first electrode) 803, a titanium dioxide semiconductor 801, an upper electrode (second electrode) 802, a third electrode 812, and an upper substrate 811. Each of these elements is formed into a plate-like shape, and they are laminated in this order.

Each of the lower substrate 815, the lower electrode 803, the titanium dioxide semiconductor 801, the upper electrode 802, the third electrode 812 and the upper substrate 811 is formed into a plate-shape or a layer-shape.

In this solar cell unit 800, a sealing material 813 is provided between the lower electrode 803 and the third electrode 812, and the side face of the solar cell unit is hermetically sealed therewith.

That is, both of the titanium dioxide semiconductor 801 and the upper electrode 802 are accommodated in the space defined by the sealing material 813, the lower electrode 803 and the third electrode 812. Note that, this space may be filled with an inert gas, such as argon gas (Ar).

The titanium dioxide semiconductor 801 may have the same structure as that of each of the above-mentioned titanium dioxide semiconductors 101, 201, 301, 401, 601 and 701.

The upper substrate 811 and the lower substrate 815 may have the same structures as those of the upper substrate 711 and the lower substrate 715 as described above, respectively.

The upper electrode 802 and the lower electrode 803 may have the same structures as those of the upper electrode 702 and the lower electrode 703 as described above, respectively.

The third electrode 812 may be constructed from a transparent electrode made of ITO or the like or a metallic electrode (which is made of metal which is selected from the group consisting of Al, Ni, Cr, Pt, Ag, Au, Cu, Mo, Ti and Ta, an alloy containing therein any one or more of these metallic materials, or the like).

In addition, the sealing material 813 may have the same structure as that of the above-mentioned sealing material 713.

Note that, the solar cell unit 800 of this embodiment is used so that rays are made to enter from the lower side in FIG. 8.

In this solar cell unit 800, a reflecting film (reflecting plate) 816 is provided on the upper surface of the upper substrate 811, so that the rays which have passed through the titanium dioxide semiconductor 801 can be reflected towards the titanium dioxide semiconductor 801 again.

Further, in order to increase the amount of light entering the titanium dioxide semiconductor 801, an antireflection film, having the same structure as that of the above-mentioned antireflection film 712, may be provided on the lower surface of the lower substrate 815. Also, in order to prevent the lower surface of the lower substrate 815 from becoming dirty, a thin film having the same structure as that of the above-mentioned thin film 716 may be provided on the lower surface of the lower substrate 815.

In each of the solar cells employing the titanium dioxide semiconductors (titania semiconductor) 101, 201, 301, 401, 601, 701 and 801 as described above, and each of the solar cell units 100, 200, 600, 700 and 800, when it is assumed that photoelectric conversion efficiency is $R_{90}$ at the incident angle of light to the titanium dioxide semiconductor 101 of 90 degrees, and when photoelectric conversion efficiency is $R_{52}$ at the incident angle of light of 52 degrees, it is preferred that each of the solar cells and solar cell units has the property such that $R_{52}/R_{90}$ is about equal to or larger than 0.8, and more preferably, the ratio of $R_{52}/R_{90}$ is about equal to or larger than 0.85. Satisfying such a condition means that the titanium dioxide semiconductor 101 is low in directivity to the light, that is, it has the isotropy. Therefore, the solar cells and solar cell units 100, each having such a titanium dioxide semiconductor 101, can generate electricity with higher efficiency almost over the entire duration of hours of sunlight of the sun.

In the foregoing, the solar cell and the solar cell unit of the present invention have been described with reference to FIG. 1 to FIG. 8. However, the present invention is not intended to be limited thereto. The elements or components constituting the solar cell and the solar cell unit may be replaced with those having other structures capable of performing the same functions.

In addition, the solar cell and the solar cell unit of the present invention may be those which are obtained by combining arbitrary two or more structures of FIG. 1 to FIG. 8.

Industrial Applicability

As described above, according to the present invention, a solar cell employing a titanium dioxide ($TiO_2$) electrode (titanium dioxide semiconductor, that is titania semiconductor) has the porosity of 5 to 90%, that is the porosity is very high, and hence the surface area of the titania is remarkably increased as compared with the conventional wet solar cell in which a titania electrode is formed into a flat-shaped plate. For example, a portion of the titania defined by 1 cm$^2$ in a plane can have a total surface area of 1,000 to 10,000 cm$^2$. As a result, since the contact area between the titania and solar rays is also increased, the amount of the current flowing therethrough is mathematically expected to be 1,000 to 10,000 times as large as the case where the titania electrode is formed into a flat-shaped plate.

Further, when the titanium dioxide semiconductor contains therein impurities, such as Cr (chromium) and V (vanadium) in the range of 0.1 to 2.5 $\mu$mol/g, it becomes possible to absorb the visible rays having the wavelength of equal to or longer than 400 nm (normally, this means the rays having the wavelength of 400 to 750 nm) which cannot be efficiently absorbed by the normal titania semiconductor, so that the efficiency of the solar cell can be greatly enhanced.

What is claimed is:

1. A solar cell, comprising:
    a pair of electrodes; and
    a titanium dioxide semiconductor which is disposed between the electrodes, the titanium dioxide semiconductor having a fractal structure and defining a surface and an interior, the surface and the interior of the titanium dioxide semiconductor being formed with pores, and the titanium dioxide semiconductor being arranged so as to form a rectification barrier with respect to at least one of the pair of electrodes.

2. The solar cell as set forth in claim 1, wherein said rectification barrier is formed by contacting the titanium dioxide semiconductor with at least one of said pair of electrodes, and the rectification barrier has a diode characteristic.

3. The solar cell as set forth in claim 2, wherein the rectification barrier is the shottky barrier being formed by contacting the titanium dioxide semiconductor with at least one of said pair of electrodes.

4. The solar cell as set forth inn claim 2, wherein the rectification barrier is the PN junction being formed by contacting the titanium dioxide semiconductor with at least one of said pair of electrodes.

5. The solar cell as set forth in claim 1, wherein the electrode, with which said titanium dioxide semiconductor forms the rectification barrier, is formed in such a way as to penetrate into the surface of the titanium dioxide semiconductor and the interior thereof.

6. The solar cell as set forth in claim 1, wherein said titanium dioxide semiconductor has a porosity of 5 to 90%.

7. The solar cell as set forth in claim 1, wherein said titanium dioxide semiconductor has a porosity of 15 to 50%.

8. The solar cell as set forth in claim 1, wherein said titanium dioxide semiconductor has a porosity of 20 to 40%.

9. The solar cell as set forth in claim 1, wherein the at least one of the pair of electrodes, with which said titanium dioxide semiconductor form the rectification barrier, is formed from a transparent electrode made of ITO, or a metallic electrode made of at least one metal selected from the group consisting of Al, Ni, Cr, Pt, Ag, Au, Cu, Mo, Ti, and Ta.

10. The solar cell as set forth in claim 1, wherein the at least one of the pair of electrodes, with which said titanium dioxide semiconductor forms the rectification barrier, includes a solid iodide.

11. The solar cell as set forth in claim 10, wherein the at least one of the pair of electrodes, with which said titanium dioxide semiconductor forms the rectification barrier, includes CuI (copper iodide).

12. The solar cell as set forth in claim 10, wherein the at least one of the pair of electrodes, with which said titanium dioxide semiconductor forms the rectification barrier, includes AgI (silver iodide).

13. The solar cell as set forth in claim 1, wherein the pair of electrodes are formed by vacuum evaporation.

14. The solar cell as set forth in claim 1, wherein the pair of electrodes are formed by spattering.

15. The solar cell as set forth in claim 1, wherein the pair of electrodes are formed by printing.

16. The solar cell as set forth in claim 1, wherein said titanium dioxide semiconductor is subjected to visual rays absorbable processing to enable absorption of visible rays.

17. The solar cell as set forth in claim 16, wherein organic dye is absorbed to said titanium dioxide semiconductor.

18. The solar cell as set forth in claim 16, wherein inorganic dye is absorbed to said titanium dioxide semiconductor.

19. The solar cell as set forth in claim 18, wherein the inorganic dye, being absorbed to said titanium dioxide semiconductor, includes inorganic carbon.

20. The solar cell as set forth in claim 16, wherein the inorganic dye, being absorbed to said titanium dioxide semiconductor, includes an inorganic matter obtained by dying carbon.

21. The solar cell as set forth in claim 16, wherein said titanium dioxide semiconductor has oxygen defects.

22. The solar cell as set forth in claim 16, wherein said titanium dioxide semiconductor includes impurities that include at least one of Cr and V.

23. The solar cell as set forth in claim 22, wherein said titanium dioxide semiconductor includes Mo.

24. A solar cell unit, comprising:
    a solar cell which includes a pair of electrodes, and a titanium dioxide semiconductor disposed between the pair of electrodes, the titanium dioxide semiconductor having a fractal structure and defining a surface and an interior, the surface and the interior of the titanium dioxide semiconductor being formed with pores; and first and second substrates, the solar cell being disposed between the first and second substrates.

25. The solar cell unit as set forth in claim 24, wherein the first and second substrates are arranged so that solar rays enter from one side of one of the first and second substrates, the other substrate being arranged at a side of the one substrate that is opposite to the one side and being coated with a reflection film or having a reflection film thereon.

26. The solar cell unit as set forth in claim 24, wherein the first substrate and the second substrate define a space therebetween, the space being filled with an inert gas including argon gas.

27. The solar cell unit as set forth in claim 24, wherein at least one of the first and second substrates being arranged at a side from which solar rays enter, the at least one of the first and second substrates being formed into a transparent substrate or a translucent substrate formed of at least one of glass, plastic and synthetic resin.

28. The solar cell unit as set forth in claim 24, wherein at least one of the first and second substrates is arranged at a side from which solar rays enter, the at least one of the first and second substrates having a top surface and a bottom surface, and an anti-reflection film is coated or placed on at least one of the top surface and the bottom surface.

29. The solar cell unit as set forth in claim 24, wherein at least one of the first and second substrates is arranged at the side from which solar rays enter, the at least one of the first and second substrates having a top surface, and a light catalyst made of titanium dioxide ($TiO_2$) is coated on or placed on the top surface of the at least one of the first and second substrates.

* * * * *